(12) United States Patent
Nagarajan et al.

(10) Patent No.: US 7,072,557 B2
(45) Date of Patent: Jul. 4, 2006

(54) INP-BASED PHOTONIC INTEGRATED CIRCUITS WITH AL-CONTAINING WAVEGUIDE CORES AND INP-BASED ARRAY WAVEGUIDE GRATINGS (AWGS) AND AVALANCHE PHOTODIODES (APDS) AND OTHER OPTICAL COMPONENTS CONTAINING AN INALGAAS WAVEGUIDE CORE

(75) Inventors: Radhakrishnan L. Nagarajan, Cupertino, CA (US); Andrew G. Dentai, Mountain View, CA (US); Fred A. Kish, Jr., Palo Alto, CA (US)

(73) Assignee: Infinera Corporation, Sunnyvale, CA (US)

( * ) Notice: Subject to any disclaimer, the term of this patent is extended or adjusted under 35 U.S.C. 154(b) by 64 days.

(21) Appl. No.: 10/327,362

(22) Filed: Dec. 20, 2002

(65) Prior Publication Data

US 2003/0165314 A1 Sep. 4, 2003

Related U.S. Application Data

(63) Continuation-in-part of application No. 10/267,331, filed on Oct. 8, 2002, and a continuation-in-part of application No. 10/267,304, filed on Oct. 8, 2002.

(60) Provisional application No. 60/342,984, filed on Dec. 12, 2001.

(51) Int. Cl.
*G02B 6/00* (2006.01)

(52) U.S. Cl. ...................................... 385/131

(58) Field of Classification Search ........ 385/129–131, 385/14–15; 257/184, 199, 201
See application file for complete search history.

(56) References Cited

U.S. PATENT DOCUMENTS 4,258,375 A 3/1981 Hsieh et al. ............... 357/16

(Continued)

FOREIGN PATENT DOCUMENTS

JP 63198321 8/1988

(Continued)

OTHER PUBLICATIONS

Isao Watanabe et al., "Design and Perfromance of InAlGaAs/InAlAs Superlattice Avalanche Photodiodes", *Journal of Lightwave Technology*, vol. 15(6). pp. 1012-1019, Jun. 1997.

(Continued)

*Primary Examiner*—Thien M. Le
*Assistant Examiner*—Edwyn Labaze
(74) *Attorney, Agent, or Firm*—W. Douglas Carothers, Jr.

(57) ABSTRACT

The Group III–V quaternary, InAlGaAs is employed as a waveguide layer in optical components, such as In-P based array waveguide gratings (AWGs), avalanche photodiodes (APDs) or other optical components that contain a waveguide core in the InP regime. The deployment of InAlGaAs waveguides provides for high uniform photoluminescent (PL) emission wavelength across the wafer for InAlGaAs waveguides as compared to InGaAsP waveguides as now commonly employed in such optical devices or components. The use of an InAlGaAs waveguide core has particular utility when deployed in a photonic integrated circuit (PIC) such as an AWG with a plurality of outputs optically integrated with a plurality of photodetectors, such as APDs which are exemplified in this disclosure. In lieu of an InAlGaAs waveguide, combination layers of InGaAs/InAlAs, InGaAs/InAlGaAs or InAlAs/InAlGaAs may be employed or stacks of such layers to form the waveguides in the PIC chip.

48 Claims, 5 Drawing Sheets

U.S. PATENT DOCUMENTS

| | | | | |
|---|---|---|---|---|
| 4,717,443 | A | | 1/1988 | Greene et al. ............... 437/228 |
| 4,840,916 | A | | 6/1989 | Yasuda et al. ................. 437/3 |
| 4,870,468 | A | | 9/1989 | Kinoshita et al. ............. 357/17 |
| 5,075,750 | A | | 12/1991 | Kagawa ........................ 357/30 |
| 5,432,361 | A | | 7/1995 | Taguchi ....................... 257/186 |
| 5,521,994 | A | | 5/1996 | Takeuchi et al. .............. 385/14 |
| 5,552,629 | A | | 9/1996 | Watanabe ................... 257/438 |
| 5,689,122 | A | | 11/1997 | Chandrasekhar ............ 257/184 |
| 5,689,358 | A | | 11/1997 | Nakao et al. ................ 359/248 |
| 5,852,304 | A | * | 12/1998 | Suzuki et al. ................. 257/17 |
| 5,863,809 | A | * | 1/1999 | Koren .......................... 438/22 |
| 5,910,012 | A | | 6/1999 | Takeuchi ..................... 438/31 |
| 5,937,274 | A | * | 8/1999 | Kondow et al. .............. 438/47 |
| 6,104,047 | A | | 8/2000 | Watanabe ................... 257/184 |
| 6,229,162 | B1 | | 5/2001 | Watanabe ................... 257/186 |
| 6,330,378 | B1 | * | 12/2001 | Forrest et al. ................. 385/14 |
| 6,417,528 | B1 | * | 7/2002 | Bond .......................... 257/186 |
| 6,594,409 | B1 | * | 7/2003 | Dutt et al. .................... 385/14 |
| 6,614,086 | B1 | * | 9/2003 | Kim et al. .................. 257/438 |
| 6,785,458 | B1 | * | 8/2004 | Mule' et al. ................ 385/131 |
| 6,801,555 | B1 | * | 10/2004 | DiJaili et al. ................. 372/37 |
| 6,813,404 | B1 | * | 11/2004 | Kato ........................... 385/14 |
| 6,853,015 | B1 | | 2/2005 | Tsuchiya |
| 2001/0030327 | A1 | | 10/2001 | Furushima .................. 257/102 |
| 2002/0195616 | A1 | * | 12/2002 | Bond .......................... 257/186 |
| 2003/0169977 | A1 | * | 9/2003 | Xu et al. ....................... 385/88 |

FOREIGN PATENT DOCUMENTS

| | | |
|---|---|---|
| JP | 02246180 | 10/1990 |
| JP | 4149512 | 5/1992 |
| JP | 10242563 | 9/1997 |

OTHER PUBLICATIONS

J. M. Dalleasse et al., "Stability of AlAs in $Al_xGa_{1-x}As$-AlAs-GaAs Quantum Well Heterostructures", *Applied Physics Letters*, pp. 2436-2438, Jun. 11, 1990.

T. A. Richard et al., "Postfabrication Native-Oxide Improvement of the Reliability of Visible-Spectrum AlGaAs-In(AlGa)P p-n Heterostructure Diodes", *Applied Physics Letters*, vol. 56(24), pp. 2972-2794, May 1995.

T. Nakata et al., "High-Speed and High-Sensitivity Waveguide InAlAs Avalanche Photodiodes for 10-40 GB/s Receivers", *The 14TH Annual Meeting of the IEEE Lasers & Electro-Optics Society* (2001 IEEE/LEOS Annual Meeting Conference Proceedings), vol. 2, pp. 770-771, Nov. 14-15, 2001.

T. Nakata et al., "10Gbit/s High Sensitivity, Low-Voltage-Operation Avalanche Photodiodes with Thin InAlAs Multiplication Layer and Waveguide Structure", *Electronic Letters*, vol. 36(24), pp. 2033-2034, Nov. 23, 2000.

Masaki Kohtoku et al., "Polarization Independent Semiconductor Arrayed Waveguide Gratings Using a Deep-Ridge Waveguide Structure", *IEICE Trans. Electron.*, vol. E81-C. pp. 1195-1204, Aug. 1988.

G.S. Kinsey et al., "Waveguide Avalanche Photodiode Operating at 1.55 mm with a Gain-Bandwidth Product of 320 GHz", *IEEE Photonics Technology Letters*, vol. 13(8), pp. 842-844, Aug., 2001.

H. S. Kim et al., "Dark Current Reduction in APD with BCB Passivation", *Electronic Letters*, vol. 37(7), pp. 455-457, Mar. 29, 2001.

J.C. Dries et al., "In0.5Ga0.47As/In0.52Al0.48As Separate Absorpotion. Charge. and Multiplication Layer Long Wavelength Avalanche Photodiode", *Electronic Letters*, vol. 35(4), pp. 334-335, Feb. 18, 1999.

C. Lenox et al., "Thin Multiplication Region InAlAs Homojunction Avalanche Photodiodes", *Applied Physics Letters*, vol. 73(6), pp. 783-784, Aug. 10, 1998.

J. C. Campbell et al., "Frequency Response of InP/InGaAsP/InGaAs Avalanche Photodiodes", *Journal of Lightwave Technology*, vol. 7(5). pp. 778-784, May, 1989.

Toshiaki Kagawa et al., "InGaAsP-InAlAs Superlattice Avalanche Photodiode", vol. 28(6), pp. 1419-1423, Jun. 1992.

Ravi Kuchibhotla et al., "Delta-Doped Avalanche Photodiodes for High Bit-Rate Lightwave Receivers", *Journal of Lightwave Technology*, vol. 9(7), pp. 900-905, Jul. 1991.

L. E. Tarof et al., "High-Frequency performance of Separate Absorption Grading, Charge, and Multiplication InP/InGaAs Avalanche Photodiodes", *IEEE Photonics Technology Letters*, vol. 13(8), Aug. 2001, *IEEE Photonics Technology Letters*, vol. 5(6), pp. 672-674 Jun., 1993.

Y. Hirayama et al., "Low Temperature and Rapid Mass tranport Techniques for GaInAsP/p-InP DFB Lasers", Inst. Phys. Conf. Ser. No. 79: Chapter 3, pp. 175-180, Int. Symp. on GaAs and Related Components, Karuizawa, Japan, 1985.

* cited by examiner

INP-BASED PHOTONIC INTEGRATED CIRCUITS WITH AL-CONTAINING WAVEGUIDE CORES AND INP-BASED ARRAY WAVEGUIDE GRATINGS (AWGS) AND AVALANCHE PHOTODIODES (APDS) AND OTHER OPTICAL COMPONENTS CONTAINING AN INALGAAS WAVEGUIDE CORE

REFERENCE TO RELATED APPLICATION

This application claims priority of provisional application, Ser. No. 60/342,984, filed Dec. 21, 2001, which provisional application is incorporated herein by its reference, and this application is a continuation-in-part of nonprovisional patent applications, Ser. No. 10/267,331, filed Oct. 8, 2002 and entitled, TRANSMITTER PHOTONIC INTEGRATED CIRCUITS (TxPIC) AND OPTICAL TRANSPORT NETWORKS EMPLOYING TxPICs; and Ser. No. 10/267,304, filed Oct. 8, 2002; and entitled, AN OPTICAL SIGNAL RECEIVER PHOTONIC INTEGRATED CIRCUIT (RxPIC), AN ASSOCIATED OPTICAL SIGNAL TRANSMITTER PHOTONIC INTEGRATED CIRCUIT (TxPIC) AND AN OPTICAL TRANSPORT NETWORK UTILIZING THESE CIRCUITS, which nonprovisional patent applications are incorporated herein by their reference.

BACKGROUND OF THE INVENTION

1. Field of the Invention

This invention relates generally to semiconductor active and passive devices, such as photonic, electronic or opto-electronic devices or array waveguide gratings (AWGs) and other passive waveguides, and more particularly to waveguide structures in InP based components such as, for example, InP based array waveguide gratings (AWGs) and avalanche photodiodes (APDs).

2. Description of the Related Art

In the past, array waveguide gratings (AWGs), avalanche photodiodes (APDs) or other optical active and passive components that contain or include a waveguide core based in an InP regime or material system have utilized InGaAsP as a waveguide layer or waveguide core. The filter characteristics of these devices are extremely sensitive to any variations in the composition of Group III–V materials utilized to form the waveguide layer or core in such devices as the same is epitaxially formed with planarity across an InP wafer. An InGaAsP waveguide core is problematic due to the fact that significant composition variations occur across the wafer as the material is grown epitaxially, which is typically via a MOCVD reactor. As a result, longitudinally or transversely, these waveguide structures in the resulting optical or opto-electronic devices have these same variations along their paths, meaning that their refractive index may vary along their length and width. These variations are typically caused by variations in the As/P composition ratio and occur due to the fact that the source gases typically utilized to grow this material, e.g., $AsH_3$ and $PH_3$, have significantly different cracking efficiencies as a function of temperature. Consequentially, the photoluminescent (PL) emission wavelength, which directly relates to compositional variations, varies by about 10 nm to about 20 nm across the wafer for InGaAsP as-grown materials or layers. These composition variations wreak havoc on the performance and yield of InP-based AWGs and other optical components that utilize InGaAsP as the core waveguide layer. Furthermore, InGaAsP materials can also be difficult to target (reproducibility) from one epitaxial growth to the next, further affecting performance and yield.

Other group III–V waveguide materials and regimes have been utilized and are known in the art. The particular interest here is the InP regime where InAlGaAs provides a high refractive index for waveguiding properties as InGaAsP. The use of InAlGaAs material as a waveguide core in InP semiconductor devices is known. For example, see U.S. Pat. No. 5,910,012 and FIGS. 7A–7C directed to a photodetector structure and a spot size converter (SSC) or tapered section where InAlGaAs is suggested for the quantum well core layer at 7a, 7b and 7c. Also, in U.S. Pat. No. 5,689,358 and the description of FIGS. 47–49, it is indicated that a spot size converter (SSC) can be fabricated with a waveguide core of InAlGaAs. However, there is no teaching or appreciation in the art of utilizing InAlGaAs waveguide structures in photonic integrated circuits (PICs) where high wavelength uniformity is required, necessary and achieved across the wafer when deploying InAlGaAs in lieu of InGaAsP as the waveguide or core for the optical coupling path among plural active and passive optical components integrated in the PIC.

The uniformity across an as-grown wafer, such as an InP wafer, becomes much more important when multiple optical components and electro-optical components are together fabricated as a photonic integrated circuit (PIC) formed in multiple chip or die in the wafer because enhances the probability of achieving higher batch-to-batch reproducibility of such as-grown photonic integrated circuits.

OBJECTS OF THE INVENTION

It is an object of this invention to deploy an InAlGaAs compound in the waveguide structure or in the waveguides or waveguide cores of InP-based optical components such as array waveguide gratings (AWGs), avalanche photodiodes (APDs) or other optical or opto-electronic components that contain a waveguide or core in an InP regime It is another object of this invention to deploy an InAlGaAs compound in the waveguide structure or in the waveguides or waveguide cores of InP-based optical components such as array waveguide gratings (AWGs) or avalanche photodiodes (APDs) which are integrated in a monolithic photonic integrated circuit (PIC) having a common, continuous waveguide or core, such as, for example, comprising InAlGaAs, optically coupling all the optical components in the PIC.

Another object of this invention is the provision of a waveguide in a semiconductor optical component comprising InAlGaAs, combined layers of InGaAs/InAlAs, InGaAs/InAlGaAs or InAlAs/InAlGaAs or stacks of such layers, the deployment of the waveguide core providing for high uniform photoluminescent (PL) emission wavelength across the wafer from which the chip was part thereof.

SUMMARY OF THE INVENTION

According to this invention, the performance and yield of InP-based optical components, such as array waveguide gratings (AWGs) and avalanche photodiodes (APDs) is greatly improved by replacing the InGaAsP waveguide generally present in these InGaAsP/InP devices with an Al-containing quaternary, InAlGaAs waveguide. InAlGaAs is superior to InGaAsP in the case of both reduced compositional quaternary variations as evidenced by photoluminescent (PL) emission wavelength variations across the wafer as well as higher run-to-run reproducibility in a MOCVD reactor. The deployment of InAlGaAs waveguides provides for high uniform photoluminescent (PL) emission wavelength across the wafer for InAlGaAs waveguides as compared to InGaAsP waveguides as now commonly employed in such optical devices or components. For example, typical variation of PL wavelength across a 2 inch wafer for InAlGaAs is less than 2 nm which is dramatically much less than that for InGaAsP across a 2 inch wafer which is in the range of approximately 10 nm to 20 nm. As a result, the performance and yield of optical components is significantly improved for devices that utilize InAlGaAs instead of InGaAsP as the basic waveguide or core material in the device or circuit waveguide. Note that any waveguide or core structure that currently employs InGaAsP can be transformed, via this invention, to InAlGaAs whether a discrete component or multiple optically coupled components formed in photonic integrated circuits (PIC).

The use of an InAlGaAs waveguide core has particular utility when deployed in a photonic integrated circuit (PIC) such as an AWG with a plurality of outputs optically integrated with a plurality of photodetectors, such as APDs which are exemplified in this disclosure. In lieu of an InAlGaAs waveguide, combination layers of InGaAs/InAlAs, InGaAs/InAlGaAs or InAlAs/InAlGaAs may be employed or stacks of such layers to form the waveguides in the PIC chip. The InAlGaAs waveguide core may be utilized in optical transmitter photonic integrated circuit (TxPIC) chips as exemplified in the previously incorporated patent application, Ser. No. 10/267,301, which PICs include, for example, an array of laser sources and electro-optical modulators and a wavelength selective combiner. Also, the InAlGaAs waveguide core may be utilized in optical receiver photonic integrated circuit (RxPIC) chips as exemplified in the previously incorporated patent application, Ser. No. 10/267,304, which PICs include a wavelength selective combiner and an array of photodetectors.

In another feature of this invention, a non-Al-containing layer is directly deposited on the InAlGaAs waveguide core or layer formed in an InP-based semiconductor device to bury the Al-containing waveguide or core layer, protecting it from subsequent oxidation and degradation, particularly during subsequent epitaxial regrowth or heat treatment processes.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DETAILED DESCRIPTION OF THE INVENTION

As used herein, the term, "waveguide" is also an optical waveguide core or material as well as any other optical waveguide in a semiconductor Group III–V as-grown structure or device. In the case of waveguide cores, the core can be continuous and co-planar or stepped and non-planar from one optical component to another among one or more optical components in a photonic integrated circuit (PIC).

Reference now is made to FIGS. 1–5 for examples of semiconductor structures that may utilize an InAlGaAs quaternary compound as a waveguide or core in accordance with this invention. The semiconductor structures shown in FIGS. 1–5 are, therefore, exemplary of the deployment of this invention.

Also, as used herein, an optical combiner may be comprised of a power coupler, star coupler, a MMI coupler, an Echelle grating or an arrayed waveguide grating (AWG). To be noted is that there is an absence in the art, at least to the present knowledge of the inventors herein, of the teaching and disclosure of an array of modulated sources and wavelength selective optical multiplexer, e.g., such as an arrayed waveguide grating (AWG) or Echelle grating. In this disclosure, a wavelength selective multiplexer or combiner is defined as one that has less than 1/N insertion loss wherein N is the number of modulated sources being multiplexed. One principal reason is that it is difficult to fabricate, on a repeated basis, an array of lasers with a wavelength grid that simultaneously matches the wavelength grid of a wavelength selective combiner (e.g., an AWG). The AWG is preferred because it can provide a lower loss multiplexing structure. Additionally, an AWG may provide a narrow passband for grid wavelengths of and array of laser sources in a TxPIC chip, such as an array of DFB lasers. A wavelength selective combiner has its input optically coupled to received all the channel signal outputs from the modulated sources and provide a multiplexed output signal on an output waveguide from the chip, the modulated sources, combiner and output waveguide all integrated on a single InP chip. See, in this connection, the incorporated patent applications, Ser. Nos. 10/267,331 and 10/267,304 which disclose many different embodiments of a TxPIC and RxPIC and applications of TxPICs and RxPICs in an optical telecommunications network.

The advantages of deploying a power combiner instead of an AWG multiplexer is that its insertion loss relative to frequency is not dependent on temperature changes or variations that occur due epitaxial growth as in the case of a wavelength selective combiner. However, it has significantly higher insertion loss for multiple signal channels, which insertion loss is dependent of critical dimension variation. Such a power combiner is desirable in systems implementation wherein the link budget is not limited by the launch power. That is, the reach of the system decreases sub-linearly with the decrease in launched power from a TxPIC chip. Also, such a TxPIC minimizes the amount of required temperature tuning as there is no need to match the grid of the combiner to that of the grid of the transmission sources.

Figure 1:
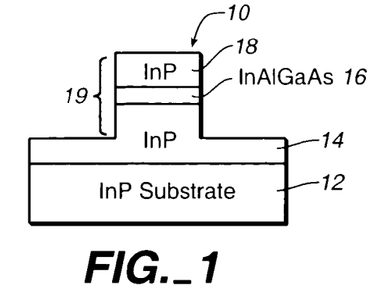
FIG. 1 is a cross-sectional schematic view of an exemplary waveguide structure for application of this invention comprising an air-clad ridge waveguide with an InAlGaAs waveguide core.

As shown in FIG. 1, an air-clad ridge waveguide structure 10 is shown comprising an InP layer 14 grown in an epitaxial reactor, such as a MOCVD reactor, on an InP substrate 12. This is followed by the growth of an InAlGaAs waveguide layer 16, lattice matched or pseudomorphic strained relative to InP, on the first-growth InP layer 14. Next, a second InP layer 18 is grown on the InAlGaAs waveguide layer 16. This followed by an etch back to provide a mesa or ridge structure 19 comprising these three as-grown layers, as illustrated in FIG. 1. While upper InP layer 18 provides a lower refractive index cladding for optical waveguiding through the InAlGaAs waveguide, it also protects the core from degradation due to subsequent oxidation. This is, of course, also true for the other embodiments of FIGS. 2–5.

Figure 2:
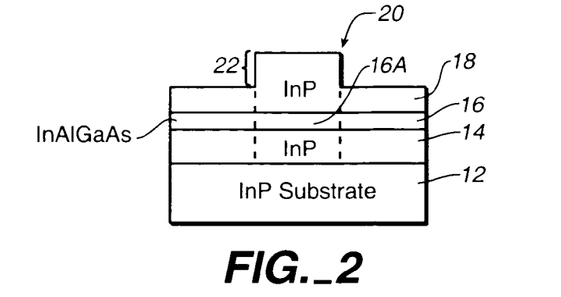
FIG. 2 is a cross-sectional schematic view of an exemplary waveguide structure for application of this invention comprising a ridge waveguide with an underlying InAlGaAs waveguide core.

FIG. 2 shows an InP ridge structure 20 with a buried InAlGaAs waveguide 16A. InP layer 14 is grown first on InP substrate 12 in an epitaxial reactor followed by an InAlGaAs waveguide layer 16, lattice matched or pseudomorphic strained relative to InP, on the first growth InP layer 14. This is followed by the growth of a relatively thick second InP layer 18. To form a ridge guide structure 22, the second InP as-grown layer 18 is etched back to a region above the InAlGaAs waveguide as illustrated in FIG. 2.

Figure 3:
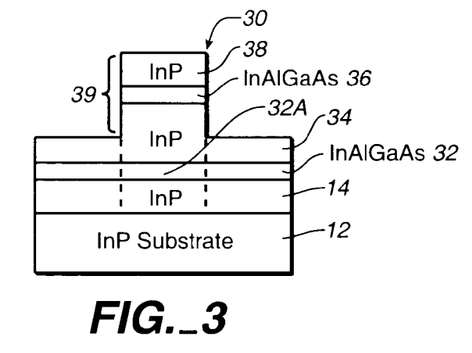
FIG. 3 is a cross-sectional schematic view of an exemplary waveguide structure for application of this invention comprising a rib-loaded slab with an InAlGaAs waveguide core and underlying InAlGaAs core waveguide.

FIG. 3 illustrates another structure comprising a rib-loaded slab structure 30 which is, in essence, a combination of the structures 10 and 20 shown in FIGS. 1 and 2. A first InP layer 14 is grown on an InP substrate 12 in a epitaxial reactor followed by an InAlGaAs waveguide 32, lattice matched or pseudomorphic strained relative to InP, a second InP layer 34, a second InAlGaAs waveguide core 38, lattice matched or pseudomorphic strained relative to InP, and a third InP layer 38. Then, an etch back is performed into the second InP as-grown layer 34 forming a ridge structure 39 containing the second InAlGaAs waveguide 36 with the first InAlGaAs waveguide core layer 32 remaining buried within structure 30 forming buried waveguide 32A.

Figure 4:
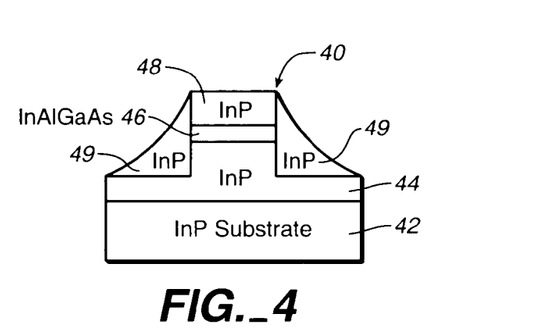
FIG. 4 is a cross-sectional schematic view of an exemplary waveguide structure for application of this invention comprising a buried heterostructure with an InAlGaAs waveguide core.

FIG. 4 illustrates a further structure 40 comprising a buried heterostructure (BH) where, for example, the InAlGaAs waveguide layer 46 may be an active layer for an active semiconductor device, such as a BH laser diode, semiconductor optical amplifier (SOA), a photodiode such as an avalanche photodiode (APD) or PIN photodiode, or other optical components that contain an InAlGaAs waveguide or core in an InP regime. The ridge waveguide structure 40 is fabricated by first growing an InP layer 44 in an epitaxial reactor, such as a MOCVD reactor, on an InP substrate 42. This followed by the growth of an InAlGaAs waveguide layer 46, lattice matched or pseudomorphic strained relative to InP, on the first grown InP layer 44. Next, a second InP layer 48 is epitaxially grown on the InAlGaAs waveguide layer 46. This followed by a selective etchback into these three as-grown layers, either performed in the epitaxial reactor or in etching equipment, forming a mesa or ridge structure 47 as illustrated in FIG. 4. Next, a regrowth comprising InP is performed to form layers 49 forming a buried waveguide structure as shown in FIG. 4. Care must be taken to prevent oxidation of the edges of the InAlGaAs waveguide layer 16 prior to the regrowth of InP which buries the edges of this layer; otherwise, good regrowth over the exposed edges of the InAlGaAs waveguide layer 46 will not occur. It is very difficult to epitaxially grow on exposed Al-containing layers that have oxidized as they will not readily accept epitaxial regrowth of crystalline material.

Figure 5:
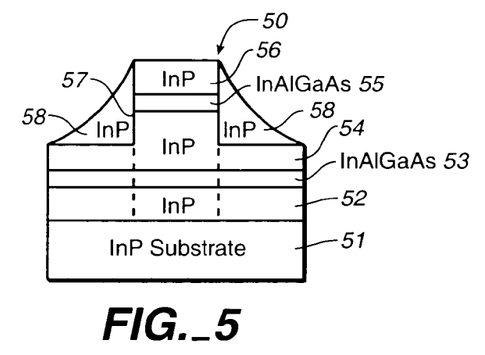
FIG. 5 is a cross-sectional schematic view of an exemplary waveguide structure for application of this invention comprising a buried rib-loaded slab with an InAlGaAs waveguide core and underlying InAlGaAs waveguide core.

A buried structure similar to the structure 30 of FIG. 3 may be accomplished for the buried structure 50 as illustrated in FIG. 5. A first InP layer 52 is grown on an InP substrate 51 in a epitaxial reactor followed by growth of an InAlGaAs waveguide 53, a second InP layer 54, a second InAlGaAs waveguide 55 and a third InP layer 56. Then, an etchback is performed back into second InP as-grown layer 54 forming a ridge structure 57 containing second InAlGaAs waveguide 55 with first InAlGaAs waveguide layer 52 remaining buried within the structure. This etchback may be performed either in the epitaxial reactor or in etching equipment to form a mesa or ridge structure 57 as illustrated in FIG. 5. Next, a regrowth comprising InP is performed comprising layers 58 forming a totally buried structure 50 as shown in FIG. 5.

It should be noted that the dual InAlGaAs waveguide structures 30 and 50 of FIGS. 3 and 5 can be optical coupled to one another where the propagating mode in one waveguide extends into the adjacent waveguide via layer 32 and 54, respectively, so that one of these layers may function as an InAlGaAs active region for carrier recombination to produce photons and generate light, or function as an absorption region for photons as in the case of a modulator or attenuator, while providing the coupling light from one InAlGaAs waveguide into the other InAlGaAs waveguide.

In practice, additional layers may be present in the device to ease fabrication (e.g., etch stop layers) or add additional functionality (e.g., integrated device layers, e.g., integrated photodetectors with each with a waveguide core). Note that in any of these optical structures, the InAlGaAs layers can be replaced with multiple InAlGaAs layers of varying composition and/or different doping concentration levels. In addition, relative to the foregoing embodiments as well as later embodiments to be described, the InAlGaAs layer(s) may also be replaced with (InGaAs/InAlAs) or (InGaAs/InAlGaAs) or (InAlAs/InAlGaAs) composition stacks of such layers. Furthermore, it is most desirable to have all InGaAsP layers be replaced with InAlGaAs. However, other variants are also possible wherein the most critical layers are replaced with InAlGaAs and the other as-grown layers remain as InGaAsP, for example, in cases where such Al-containing layers should be buried so as not to be exposed to an oxidizing ambient, as explained and discussed below. Moreover, to protect the InAlGaAs layer from degradation due, for example, from oxidation, a non-Al-containing layer may be deposited atop the InAlGaAs layer, such as, InP, InGaP or InGaAsP, which may function as a cap layer, such as in the case of an AWG device. Where the InAlGaAs layer functions as a waveguide core, then, in the case of InGaAsP as the embedding layer for this Al-containing layer, the InGaAsP layer should be very thin and/or have bandgap wavelength less than the designed operational wavelength of the optical semiconductor device.

In all of the foregoing structures illustrated FIGS. 1–5, the InAlGaAs waveguide(s) or core(s) can be subjected to some level of oxidation, albeit due to the reactor impurity background or occurring during removal of the structure from the reactor for further treatment steps, such as etching or heat treatment. Care must be taken in any device structure that has an InAlGaAs waveguide layer or core not be exposed to air (e.g., see FIGS. 1–3) as the exposed Al-bearing layer will oxidize and deteriorate over time as discussed in the article of J. M. Dallesasse et al. entitled, "Stability of AlAs in $Al_xGa_{1-x}As$-AlAs-GaAs Quantum Well Heterostructures", *Applied Physics Letters*, Vol. 56(24), pp. 2436–2438, Jun. 11, 1990. Thus, any exposed Al-bearing layers are preferably passivated. This can be achieved in a variety of ways, including using BCB or a dielectric layer that covers the exposed Al-bearing layer(s). Alternatively, the exposed Al-bearing layer(s) may be passivated by forming a native oxide such as taught in the article of T. A. Richard et al. entitled, "Post-Fabrication Native-Oxide Improvement of the Reliability of Visible-Spectrum AlGaAs-In(AlGa)P p-n heterostructure diodes", *Applied Physics Letters*, Vol. 66(22), pp. 2972–2974, May 1995, which article is incorporated herein by its reference. Also, the InAlGaAs waveguide layer may be passivated by utilizing an InP mass-transported layer. This may be accomplished by creating a non-vertical wall on the edge of the waveguide or by creating a vertical sidewall via selective, controlled etching of a small thickness of the InAlGaAs layer(s) that are exposed to the ambient, and thereafter performing a mass transport (MT) process as is known in the art, particularly in the case of the quaternary, InGaAsP. See, as an example, the Japanese published Patent Application No. 041495121 published May 22, 1992 (Application No. 02272392 filed Oct. 15, 1990) which illustrates the etchback of a InGaAsP layer in a mesa structure in the InP regime and the subsequent mass transport treatment to bury the etched back InGaAsP layer with InP material via the mass transport technique. Also, see the article of Y. Hirayama et al., "Low Temperature and Rapid Mass Transport Technique for InGaAsP/InP DFB Lasers", Inst. Phys. Conf. Ser. No. 79; Chapter 3, Paper presented in *Ints. Symp. GaAs and Related Compounds*, Karuizawa, Japan, 1985, p. 175–186, relating to the manufacture of a mesa type laser called a mass transport (MT) laser. With reference to the quaternary, InAlGaAs, the utilization of the mass transport technique will be different since this as-grown layer must be protected from oxidation prior to the application of the MT technique; otherwise, the technique may not be successfully achieved. The process followed relative to the deployment of the MT technique in accordance with this invention is discussed with reference to FIGS. 6–8.

Figure 6:
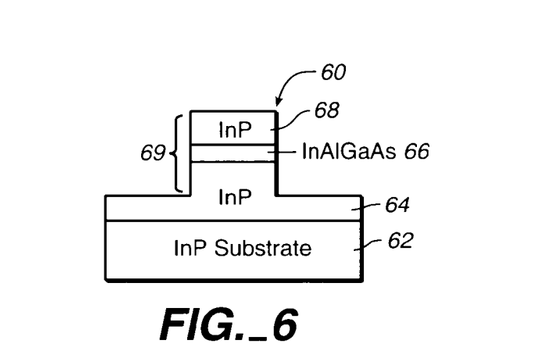
FIG. 6 is a cross-sectional schematic view of an air-clad ridge waveguide with an InAlGaAs core waveguide according to this invention, as shown in FIG. 1, prior to processing.
Figure 7:
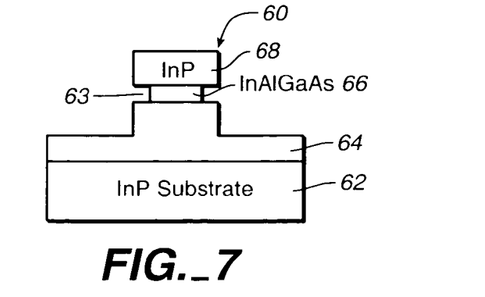
FIG. 7 is a cross-sectional schematic view of an etching step applied to the waveguide structure shown in FIG. 6 to remove outer edge portions of the InAlGaAs waveguide core.

As shown in FIG. 6, which is identical to FIG. 1, an InP structure 60 comprises an InP layer 64 is grown on an InP substrate 62 followed by an InAlGaAs layer 66, which may function as a waveguide, and an InP cap layer 68. Next, as shown in FIG. 7, waveguide layer 66 of InAlGaAs is etched back, as indicated at 63, via an etching treatment, which may be performed in a furnace or in the MOCVD reactor. An example of the etchant that may be employed for this type of etchback is $CBr_4$ or $CCl_4$ which etches the Al-containing layers but not InP.

Figure 8:
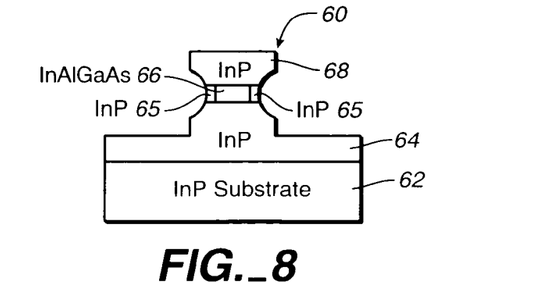
FIG. 8 is a cross-sectional schematic view of a heat treatment step to bring about mass transport to the etched structure shown in FIG. 7.

The mass transport treatment is preferably carried out in a reducing atmosphere, such as with $H_2$, and with a phosphine overpressure, such as with $PH_3$ and/or with an InP cap wafer positioned on top of the structure, in either case, to provide a source for the mass transport treatment. This treatment can be performed in either a furnace or in a MOCVD reactor. The result of the mass transport is illustrated in FIG. 8 where the mass transport treatment has filled in the void at 65 created in the previous etching step to form a buried layer of InAlGaAs, buried in all directions by InP.

Achieving a buried InAlGaAs waveguide core is problematic, particularly for the embodiments shown in FIGS. 4 and 5. As previously discussed, difficulty arises from the oxidation of the InAlGaAs layer when exposed to the ambient or air prior to any ability to bury the Al-containing layers to prevent oxidation. This problem can be circumvented by desorbing the oxides after etching and taking extreme care to ensure that the bare InAlGaAs surface is not exposed to air, such as via the use of gloveboxes, loadlocks, etc. Alternatively, the InAlGaAs waveguide layer may be directly etched in-situ in an epitaxial reactor, e.g., using $CBr_4$ or $CCl_4$, and subsequently regrown (buried) in the same equipment thereby continuously maintained in a non-oxidizing environment without removing the as-grown wafer from the epitaxial reactor.

Figure 9:
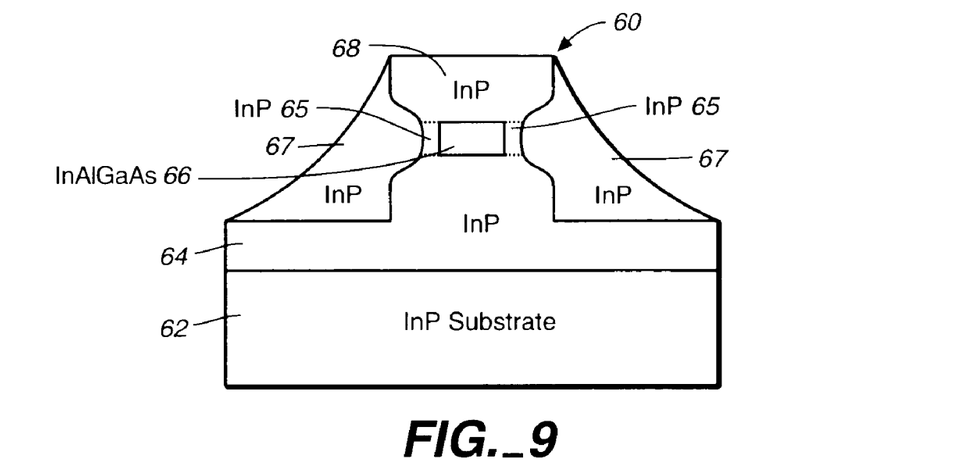
FIG. 9 is a cross-sectional schematic view of a further step to form a buried heterostructure of the structure shown in FIG. 8.

Another option is to utilize the mass transport process relative to the embodiments as shown in FIGS. 4 and 5 followed by a regrowth step comprising the buried InP. Such a semiconductor device is shown in FIG. 9 wherein the structure 60 as shown in FIG. 7 is etched followed by a mass transport treatment as illustrated in FIG. 8 without any exposure of the structure to the ambient, i.e., the structure remains in the growth reactor. Next, a regrowth process is initiated in the epitaxial reactor to grow the InP overlayer 67 completing the structure 60 as shown in FIG. 9.

The key to the use of the process according to this invention is to ensure there is no oxide formation can occur after performing the etching step illustrated in FIG. 7 and/or absorbing or forming any oxide after completion of the etching of the InAlGaAs layer 66, prior to the mass transport process step.

Figure 10:
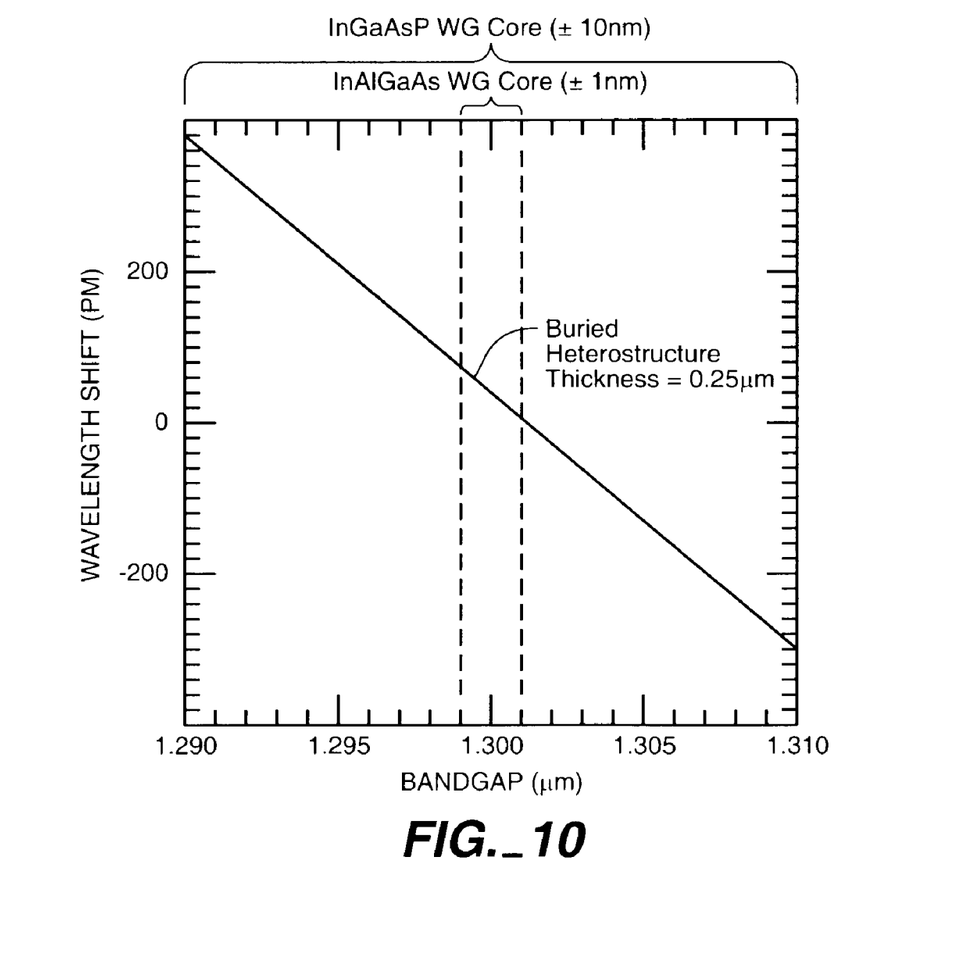
FIG. 10 is a graphic illustration of the birefringence for both a 0.25 µm thick InGaAsP waveguide and a 0.25 µm thick InAlGaAs waveguide as a function of linear variations in the waveguide core as expressed in PL emission wavelength.

An illustration of the improvement in AWG characteristics that may be achieved with the use of InAlGaAs waveguide structures versus InGaAsP waveguide structures is shown in FIG. 10. This graphic illustration shows the birefringence of the AWG, expressed in µm, as a function of variations in the waveguide bandgap across the layer, as expressed in wavelength shift. As indicated earlier, a variation of a ±1 nm across a wafer may be expected for such an InAlGaAs waveguide whereas variation of approximately ±10 nm is expected for an InGaAsP waveguide, formed in either case as a buried heterostructure, i.e., InP/InAlGaAs/InP and InP/InGaAsP/InP. The birefringence variation, expressed as $\Delta\lambda_{TE-TM}$, for the InAlGaAs curve (±1 nm) is approximately ±3 GHz whereas the variation for an InGaAsP curve (±10 nm) is approximately ±30 GHz. Thus, the yield for good devices across an InP wafer would be significantly improved with the deployment of InAlGaAs as the waveguide material of choice.

Reference is now made to the utilization of InAlGaAs waveguides in an active structure, with reference to a photodetector structure and its integration into a photonic integrated circuit (PIC). In the illustrations here, an avalanche photodiode is illustrated but it should be understood that the principal here can be equally applied to other active devices and photodetectors, such as a PIN photodiode.

Figure 11:
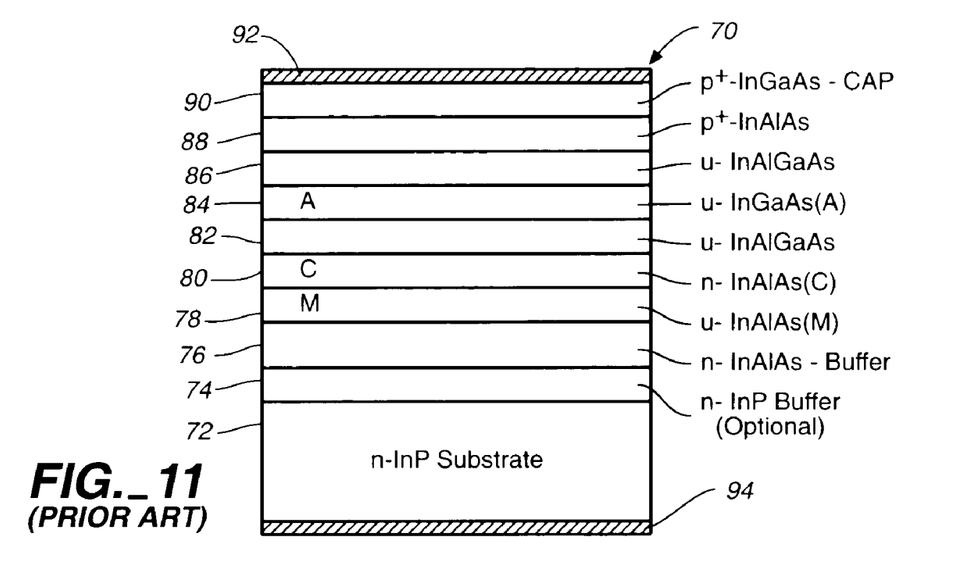
FIG. 11 is a cross-sectional schematic view of an optical component comprising an avalanche photodiode as known in the art.

Reference is made to FIG. 11 which comprises a waveguide avalanche photodiode (WG-APD) structure 70 as known in the art which is disclosed and described in an article of G. S. Kinsey et al. Entitled, "Waveguide Avalanche Photodiode Operating at 1.55 µm with a Gain-Bandwidth Product of 320 GHz", *IEEE Photonics Technology Letters*, Vol. 13(8), pp. 842–844, August, 2001, which article is incorporated herein by its reference. WG-APD device 70 comprises an InGaAs/InAlGaAs structure epitaxial grown on an InP substrate where the InAlAs layers are lattice matched to the InP substrate 72, i.e., $In_{0.52}Al_{0.48}As$. After initial growth of an InP buffer layer 74 on substrate 72, an initial InAlAs layer 76 is grown followed by a multiplication (M) layer 78 of undoped InAlAs. Next, a charge (C) layer 80 comprising p-doped InAlAs is grown followed by two waveguiding layers 82 and 86 of undoped InAlGaAs between which is an undoped absorption (A) InGaAs layer 84. Thus, absorption layer 84 of device 70 separates two waveguide layers 82 and 86 which, together, have a total thickness which is about the same as the thickness of absorption layer 82. This is followed by the deposition of a $p^+$-InAlAs layer 88 and a cap layer 90 of $p^+$-InGaAs. WG-APD device 70 is completed with a p-metal contact 92 and an n-metal contact 94.

The problem with this type of WG-APD structure 70 is that, in the case of integration with other optical components, such as in a photonic integrated circuit (PIC), it is necessary to have at least one regrowth step, if not a further addition regrowth step, to successfully integrate plural optical components. This is because some optical components require additional different layers of III–V compounds or different doping levels or layer thicknesses, or a combination of the foregoing, to achieve desirable quantum efficiency, optical throughput and lowest insertion loss in the integrated circuit design. As a result, where the design includes Al-containing layers, as is the case of many Al-containing layers 76, 78, 80, 82, 86 and 88 in this WG-APD design, there is the problem of oxidation and contamination of the structure between growth processes so that the device will fail to function upon its fabrication. However, the waveguide of choice, as explained above, is an Al-containing quaternary, InAlGaAs waveguide, as utilized in the WG-APD of FIG. 11 at 82. For the purpose of regrowth and integration into a PIC design, we provide a WG-APD device 100, shown in FIG. 12, where InAlGaAs waveguide 112 is covered by an InP stop etch layer 114. In this manner, InAlGaAs waveguide 112 as well as underlying Al-containing layers are protected from the ambient as well as background doping in the reactor prior to initiation of a second growth or regrowth process. WG-APD device 100 comprises n-InP substrate 102 upon which is epitaxially deposited via MOCVD n-InP buffer layer 104 (optional) followed with an undoped InAlAs buffer layer 106. Next, as is true also in the device 70 of FIG. 11, an multiplication (M) layer 108 of undoped InAlAs is deposited on buffer layer 106, followed by charge (C) layer 110 comprising p-doped InAlAs followed by the epitaxial deposition of undoped InAlGaAs waveguide layer 112. This followed by the deposition of a thin stop etch layer 114 of undoped InP. Stop etch layer 114 should be as thin as possible so as not to increase the separation between the charge (C) layer 110 and undoped absorption (A) layer 116, which is deposited next on stop etch layer 114. As known in the art, if the distance between charge layer 110 and absorption layer 116 is too great, there will be an insufficient flow of carriers to the absorption layer rendering the device of poor or no operation. The deposition of absorption layer 116 is followed with the deposition of two grading layers 118 and 120, respectively undoped InGaAsP and undoped InP, followed by cap layer 122 of $p^{++}$-InGaAs. Device 100 is completed with a p-metal contact 124 and an n-metal contact 126.

Figure 12:
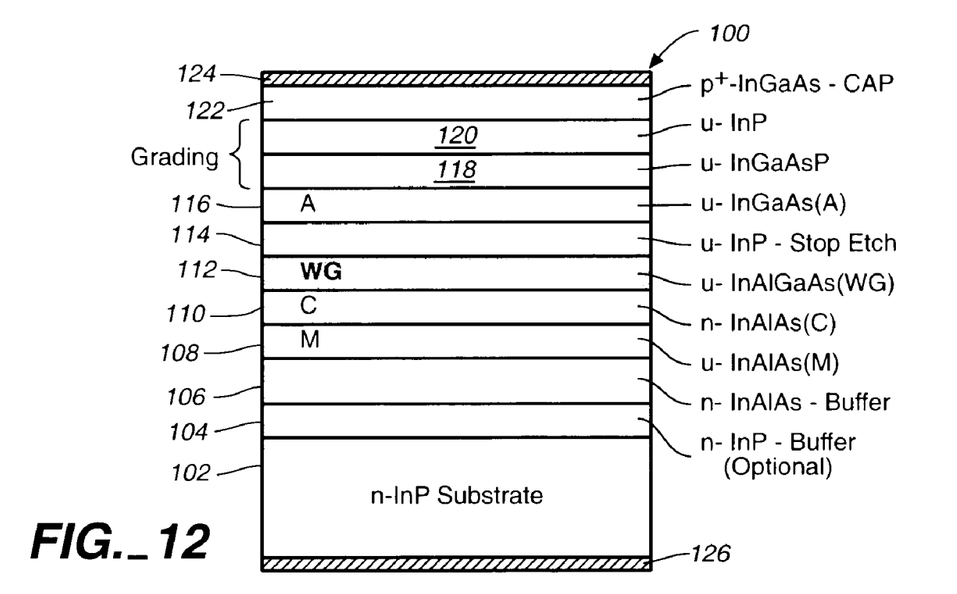
FIG. 12 is a cross-sectional schematic view of an avalanche photodiode employing an InAlGaAs waveguide according to this invention.

As previously discussed, while the use of an InAlGaAs waveguide, such as waveguide layer 112, is desirable, it is difficult to regrow over this layer because of its oxidation. As seen in FIG. 12, the InAlGaAs waveguide layer 112 is buried by InP stop etch layer 114 with both of these layers positioned between n-InAlAs charge (C) layer 110 and undoped absorption (A) layer 116. It should be noted that all the subsequent layers 116, 118, 120 and 122 grown after InP stop etch layer 114 are non-Al-containing layers, which layers may subsequently form a ridge type structure after completion of selective etching steps after which an InP regrowth process is completed, such as discussed in connection with structures 40 and 50 in FIGS. 4 and 5. There is no substantial fear of degradation to these ridge layers 116, 118, 120 and 122 since they do not include Al-containing layers and they are easier to grow via epitaxial deposition.

Other compounds of etch stop layers, i.e., other than InP, may be employed over the InAlGaAs waveguide 112, such as InGaP or InGaAsP. Where InGaAsP is utilized, in combination with InAlGaAs functioning as a waveguide, the InGaAsP stop etch layer is preferably thin, such as in a range of about 100 Å, to about 1,000 Å, and having bandgap wavelength less than operational wavelength of the device being fabricated.

It is important to note that the InAlAs layers initially formed beneath the buried InAlGaAs waveguide layer 112, i.e., multiplication (M) layer 108 and charge (C) layer 110, are desired because they provide for a better ionization coefficient and avalanche properties in APD device 100. It is even more important to note that the ability to utilize an InAlGaAs waveguide 112 in APD device 100 without degradation enables the integration of this device with an array waveguide grating (AWG) where the properties of such an InAlGaAs waveguide is highly desired, as previously discussed. Such a photonic integrated circuit will be discussed in detail later in connection with FIGS. 16 and 17.

Figure 13:
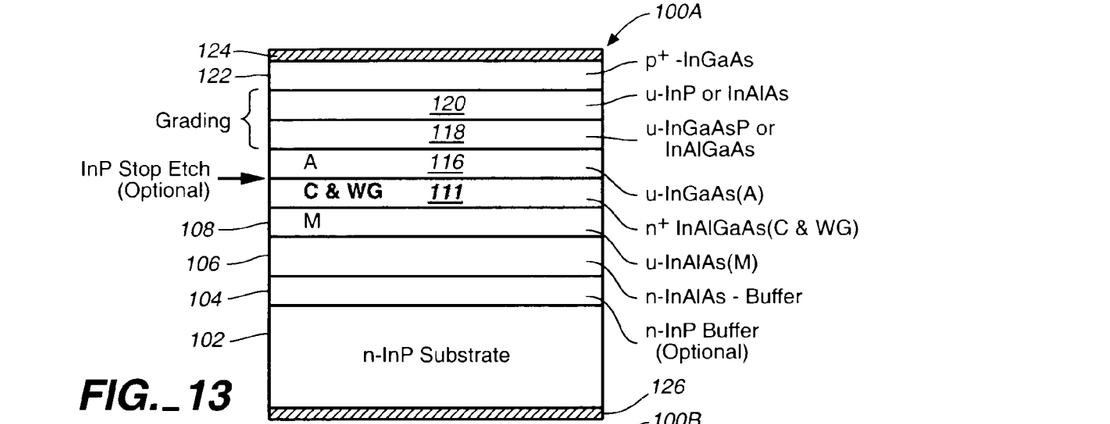
FIG. 13 is a cross-sectional schematic view of an avalanche photodiode according to this invention where the charge (C) layer of the avalanche photodiode also functions as an InAlGaAs waveguide.

It is possible that in the design of the WG-APD device 100 of FIG. 12, the spatial separation between absorption (A) layer 116 and charge (C) layer 110 will be too large for carrier transport due, in part, to the addition of InP step layer 114 as well as the presence of a sufficiently thick InAlGaAs layer 112 to function as a good waveguide at the operating wavelength of the circuit. As illustrated in FIG. 1, WG-APD device 100 can be design to split InAlGaAs waveguide layer 112 into two layers, i.e., layers 80 and 84 in FIG. 11, so that absorption layer 116 will be brought spatially closer to charge layer 110. Another approach relative to the WG-APD design of FIG. 12 is to dope InAlGaAs waveguide layer 112, at least as this waveguide exists in device 100, to function both as charge (C) layer 110 and waveguide 112 such a illustrated in FIG. 13. Thus, for the modified WG0APD device 100A shown in FIG. 13, waveguide 111, at least as it exists within the physical limits of the APD device, is doped n-InAlGaAs to function as both a waveguide core and a charge carrier (C) layer as compared to device 70 of FIG. 11 which employs multiple layers. Thus, it is within the scope of this embodiment that the continued growth of layers over the InGaAs absorption layer 116 may be Al-containing layers as seen in FIG. 13, i.e., grading layers 118 and 120 respectively of undoped InAlGaAs and InAlAs, as in the case of APD device 70 in FIG. 11. However, on the other hand, WG-APD device 100A of FIG. 13 may also include stop etch layer 114, with subsequently deposited, epitaxially grown layers 118 and 120 overlying the InP stop etch layer 114 being the same as those for APD device 100 of FIG. 12, i.e., InGaAsP and InP. Note, however, in any case, absorption layer 116 must be InGaAs.

Figure 14:
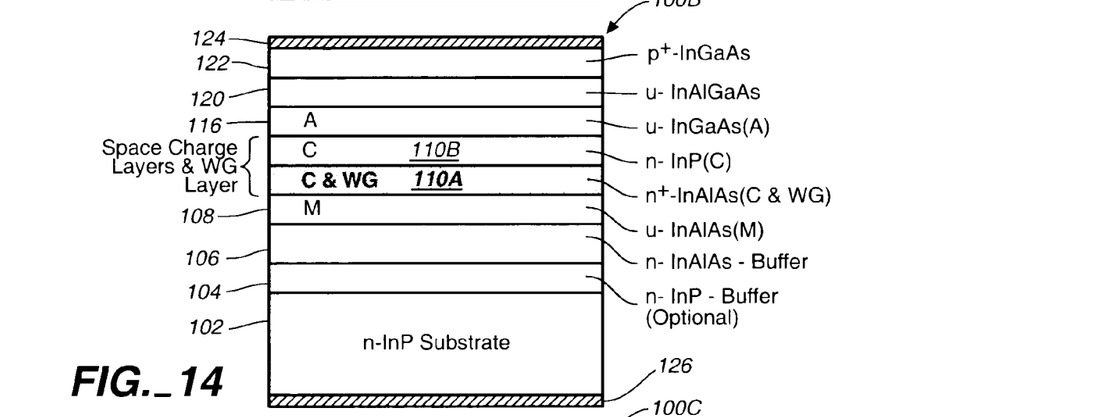
FIG. 14 is a cross-sectional schematic view of an avalanche photodiode according to this invention where the charge (C) layer of the avalanche photodiode comprises two layers to provide for a combined higher dopant concentration.

In connection with WG-APD device 100A in FIG. 13, it is difficult to dope InAlGaAs to high concentration levels, such as to levels above about $10^{17}$ or at least about $5 \times 10^{17}$, so that it is possible that the InAlGaAs waveguide will not function efficiently as a charge layer. This problem may be solved by providing a combination space charge/waveguide region having two layers, one layer comprising n-InAlGaAs and the other layer comprising n-InP, formed at least in the integrated physical boundaries of the WG-APD device in a PIC. This combination layer device 100B is illustrated in FIG. 14 where the charge (C) layer comprises n+-InAlGaAs layer 110A and n-InP layer 110B. The n-doped InP layer 110B is easily doped to high levels of concentration, such as in the range of $10^{17}$ to $10^{18}$, which is generally higher than is possible for InAlGaAs. As combined with the doped InAlGaAs waveguide or core layer 110A, the two layers provide for a high overall doping concentration. Further, the high dopant InP impurities may, to some extent, also migrate into InAlGaAs waveguide layer 110A increasing its impurity concentration level.

Figure 15:
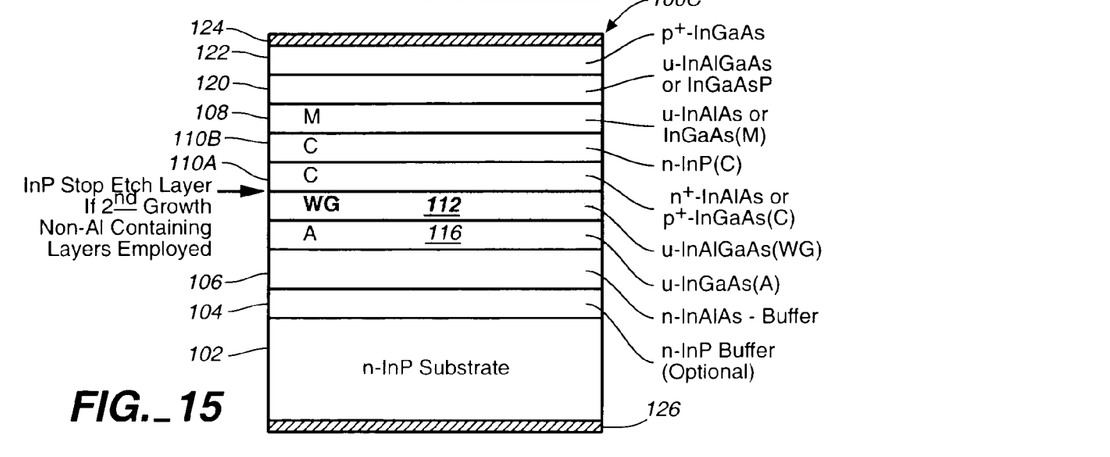
FIG. 15 is a cross-sectional schematic view of an avalanche photodiode according to this invention where the charge (C) layer of the avalanche photodiode comprises two layers to provide for a combined higher dopant concentration and function as an InAlGaAs waveguide core.

FIG. 15 illustrates another design for the WG-APD device 100B of FIG. 14. In WG-APD device 100C, the order of the separate absorption (A), charge (C) and multiplication (M) layers is reversed such that n-InAlAs buffer layer 106 is deposited after InP buffer layer 104 which is followed by the undoped absorption (A) layer 116 of InAlAs. This is followed with the epitaxial growth of the undoped InAlGaAs waveguide layer 112, followed by the epitaxial deposit of dual charge (C) layers comprising n+-InAlAs or n+-InAl-GaAs and n-InP, respectively. The remaining layers for the WG-APD may be those based on WG-APD device 11 shown in FIG. 11 comprising, in part, Al-containing layers comprising undoped multiplication (M) layer 108 of InAlAs, undoped grading layer 120 of InAlGaAs and p+-InGaAs cap layer 122. Alternatively, the design of WG-APD device 100 of FIG. 12 may be utilized such that WG-APD device 100C in FIG. 15 would include a stop etch layer 114 after the growth of InAlGaAs waveguide layer 112 followed by a regrowth including an p+-InGaAs charge (C) layer 110A (the deployment of n-InP charge layer 110B is not utilized in this configuration), an undoped InGaAs multiplication (M) layer 108, a grading layer 120 of undoped InGaAsP (and alternatively a second grading layer of InP (not shown)) and a cap layer 122 of p+-InGaAs.

Figure 16:
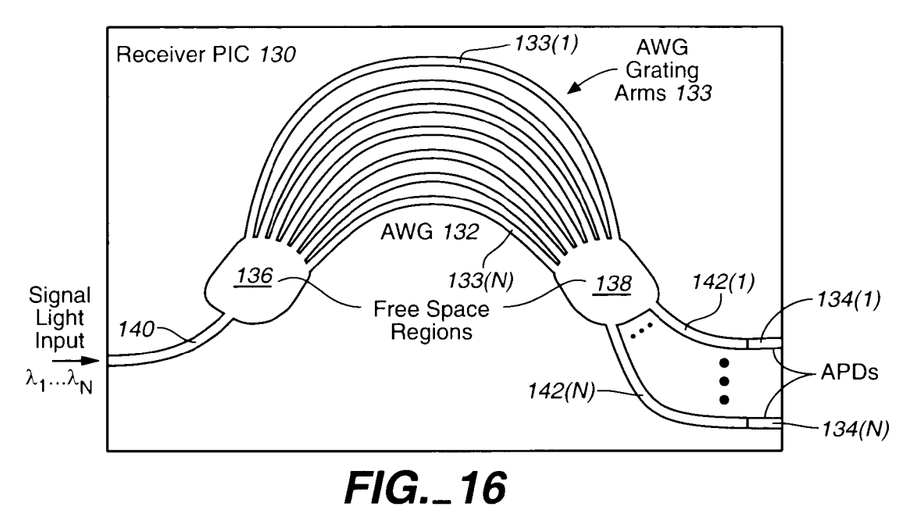
FIG. 16 is a plan schematic view of the optical receiver photonic integrated circuit (RxPIC) comprising an array waveguide grating (AWG) with a plurality of avalanche photodiodes (APDs) optically coupled via multiple InAlGaAs waveguides according to this invention.

Reference is now made to FIG. 16 which illustrates a plan view of an photonic integrated circuit (PIC) 130 constituting a single monolithic InP based chip comprising a array waveguide grating (AWG) 132 functioning in the configuration here as an optical demultiplexer, and is optically coupled to a plurality of avalanche photodiodes (APDs) 134(1) . . . 134(N) of the type illustrated, for example, in FIGS. 12–15. Again, it should be noted that other photodiodes can be utilized in PIC 130 in lieu of APDs, such as PIN photodiodes his photonic integrated circuit (PIC) 130 is also depicted generally in the provisional patent applications previously incorporated herein by reference. In Ser. No. 10/267,304, filed Oct. 8, 2002; and entitled, AN OPTICAL SIGNAL RECEIVER PHOTONIC INTEGRATED CIRCUIT (RxPIC), AN ASSOCIATED OPTICAL SIGNAL TRANSMITTER PHOTONIC INTEGRATED CIRCUIT (TxPIC) AND AN OPTICAL TRANSPORT NETWORK SYSTEM USING THE SAME, there are disclosed an optical receiver PIC (RxPIC) including signal detectors comprising photodiodes of the PIN photodiode type. The PIC circuitry disclosed in any of the embodiments in this application may be deployed here except that, in the application here, avalanche photodiodes are shown. Thus, the photodiodes, AWG and their InAlGaAs waveguides may be deployed in the drawings and figures of the foregoing applications, carrying out the purpose and function of the invention in this application in the embodiments disclosed in referenced patent application where such photodetectors may be employed.

Also, incorporated by reference herein is patent application Ser. No. 10/267,331, also filed Oct. 9, 2001 and entitled, TRANSMITTER PHOTONIC INTEGRATED CIRCUITS (TxPIC) AND OPTICAL TRANSPORT NETWORKS EMPLOYING TxPICs. In this application, there is disclosed multiple embodiments of optical transmitter PICs (TxPICs). Integrated photodiodes are disclosed in a transmitter PIC configuration in association with DFB lasers, electro-optical modulators, semiconductor optical amplifiers (SOAs) and an array waveguide grating (AWG). Thus, the photodiodes, AWG and their InAlGaAs waveguides may be deployed in the drawings and figures of this application, carrying out the purpose and function of the invention in this application in the embodiments disclosed in those applications where such photodetectors may be employed.

RxPIC 130 comprises an InP based chip having an AWG 132 with N arms 133 of different lengths disposed between two space regions 136 and 138, where N is equal to the number of transmission signal channels received for demultiplexing and detection by photodetectors 134. Space region 136 has an input waveguide 140 for receiving from and optical link, such as a point-to-point transmission system, multiplexed signal channels $\lambda_1 \ldots \lambda_N$ which are demultiplexed via AWG 132 as is well known in the art. Multiple integrated output waveguides 142(1) . . . 142(N) are provided from space region 138 and optically coupled to respective APDs 134(1) . . . 134(N). Thus, in PIC 130, InAlGaAs optical waveguides 142, 133(N) and 142(N) are provide from the PIC input to its output at photodetectors 134(N) as best illustrated in FIG. 17.

Figure 17:
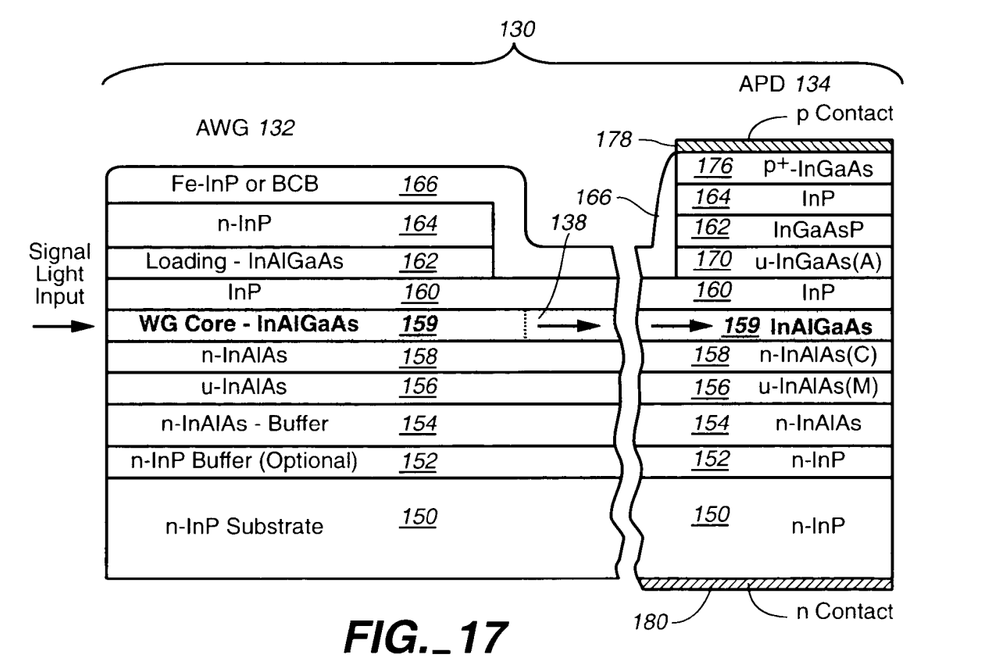
FIG. 17 is a cross-sectional schematic view of the optical receiver photonic integrated circuit (RxPIC) of FIG. 16 illustrating the InAlGaAs grating arms and free space regions of the AWG optically coupled via multiple output InAlGaAs waveguides each optically coupled to a integrated APD.

FIG. 17 illustrates a side view of RxPIC 130 of FIG. 16 relative to one grating arm 133(N) and free space region 138 of AWG 132 and one APD 134(N). As shown in FIG. 17, the functional layers of APD 134(N) may extend into the structure of AWG 132 but are not functional in this optical passive device. Thus, in such a layered PIC geometry, the InAlGaAs waveguide 133(N) and 142(N) can extend as a single optical path between or among the monolithic optical components of the PIC chip. However, in lieu of this geometry, the growth of the optical components can be of the type illustrated in FIG. 66 of incorporated nonprovisional application, Ser. No. 10/267,304 wherein the grown layers of the optical components are, in some cases, not at the same planar level as corresponding layers in adjacent optically coupled components, i.e., the InAlGaAs waveguide and its companion InP stop etch layer may be offset transversely so that the propagating mode in the PIC chip will easily coupling slightly up or down into the corresponding adjacent waveguide of an adjacent, integrated optical component that the mode traverses. This difference in planar layer level is due to the chosen fabrication procedure as is well known in the art. An example of this offset, reference is made to FIG. 7C in provisional application Ser. No. 60/328,568 where, in the AWG structure shown, the third and fourth layers epitaxially grown on the $n^+$-InP substrate would respectively be the InAlGaAs waveguide and InP stop etch layer whereas in the adjacent, integrated PIN photodiode shown in FIG. 7C of that application, the fourth and fifth layers epitaxially grown on the $n^+$-InP substrate would respectively be the InAlGaAs waveguide and InP stop etch layer which are grown at a different times relative to the same layers in the AWG structure.

In any case, in the embodiment shown in FIG. 17, the InAlGaAs waveguide 133(N), 142(N) is continuous on the same planar level in RxPIC chip 130 for all integrated optical components, although, as indicated above, this is not the only way that direct optical modal coupling can be achieved.

In FIGS. 16 and 17, monolithic integrated PIC chip 130 comprises an AWG 132 functioning as a routing device and a plurality of APDs 134(N) providing signal detection for a plurality of demultiplexed signals, $\lambda_1 \ldots \lambda_N$, received via AWG 132, which optical components are, together, realized in an InAlGaAs/InAlAs/InGaAs/InP material system. AWG 132 and WG-APD 134(N) comprise buffer layers 152 and 154 of n-InP and n-InAlAs epitaxially deposited on substrate 150 of n-InP. Next, multiplication (M) and charge (C) layers 156 and 158, respectively, of undoped InAlAs and n-InAlAs are deposited followed by optical waveguide layer 159 followed by stop etch layer 160. At this point in time, selective etching can be performed to form AWG arms 133(N) and waveguides 142(N) to photodetectors 134(N) in waveguide layer 159 employing masking and photolithography. Next, a regrowth process is performed where, first, absorption (A) layer 170 of n-InGaAs is grown only in the regions of photodetectors 134(N). This is followed by the growth of AWG loading layer 162 of InGaAsP which also serves as a grading layer for APDs 134(N) followed by cap layer 164. Next, cap or contact layer 176 is deposited in the regions of APD photodetectors 134(N). This is followed in the case of AWG 132 by formation of a passivation layer 166 of Fe doped InP or BCB is deposited over AWG 132 and p and n metal contacts 178 and 180 are deposited in regions of APDs 134(N) as shown in FIG. 17.

The inputted multiplexed signals, $\lambda_1 \ldots \lambda_N$, are received, via input waveguide 140, into first free space region 136 of AWG 132. As previously indicated, the outputs from first free space region 136 are coupled to an optical grating comprising a plurality of grating arms 133(N) of different lengths which provide a predetermined amount of path length difference to the optical signals provided at the chip input. The optical grating outputs are coupled to second free space region 138 which has a plurality of outputs to respectively receive via refraction in space region 138 a specific wavelength signal from the multiplexed signal input dependent on the grating arm lengths and optical characteristics. AWG 132 thus spectrally resolves the wavelength multiplexed signal provided at the PIC chip input by directing each wavelength signal to a distinct or designated output waveguide, each of which is optically coupled to an APD photodiode 134(N) along lithographically formed optically waveguides formed in InAlGaAs waveguide layer 159.

As shown in FIG. 17, AWG 132 and WG-APDs 134(N) may have commonly epitaxially deposited layers up to the preferred InAlGaAs waveguide layer 159 and its overlying InP stop etch layer 160. From this point on, from the standpoint of additional epitaxial growth or regrowth, different epitaxial growths may be selectively accomplished to complete the optical components completing the optical receiver PIC. In the case of the exemplary embodiment of AWG 132, the regrowth may comprise the waveguide loading layer 162 followed by a cap layer 164 of InP. The cap layer 164 may be embedded with a SI-layer of InP, e.g., Fe-InP, or, subsequentially, after all epitaxial growth is completed, embedded in a dielectric layer such as BCB.

Thus, in summary, in the case of WG-APDs 134(N), the regrowth processes are the same as those relative to WG-APD device 100 illustrated in FIG. 12. To prevent any potential oxidation, the waveguide core being protected from oxidation by the InP stop etch layer, the regrowth layers are all non-Al-containing layers. The first of such layers is the InGaAs absorption layer for the APD followed by grading layers of InGaAsP and INP and $p^+$-InGaAs cap layer. An etchant can be deployed between the AWG and APD components where the InP stop etch layer functions as the stop for the etchant. Then p and n contacts are then provided for the WG-APD as shown in FIG. 17. While device 100 shown in FIG. 17, the alternatives in the embodiments of FIGS. 13 through 15 may also be utilized in FIG. 17, taking into consideration the changes in Group III–V composition of the various epitaxially grown layers.

While the invention has been described in conjunction with several specific embodiments, it will be evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A photonic integrated circuit (PIC) formed in a chip a plurality of such chips are formed in an InP-based wafer, each chip comprising a plurality of sequentially coupled, monolithic InP-based optical components forming the integrated circuit having an input to or an output from the circuit or both and including a Al-containing waveguide core extending through the sequentially coupled optical components to provide a common waveguide core where optical components in the circuit contain a different section of the waveguide core, the Al-containing waveguide core comprising InAlGaAs, combined layers of InGaAs/InAlAs, InGaAs/

InAlGaAs or InAlAs/InAlGaAs or stacks of such layers in lieu of InGaAsP so that a birefringence variation, expressed as $\Delta\lambda_{TE-TM}$, for InAlGaAs (±1 nm) is about ±3 GHz whereas the birefringence variation for InGaAsP (±10 nm) is about ±30 GHz, the deployment of the aluminum-containing waveguide core results in higher bandgap uniformity across the waveguide core-sequentially coupled optical components in the photonic integrated circuit (PIC) compared to InGaAsP-based waveguide cores that extend beyond a single optical component and providing for high uniform photoluminescent (PL) emission wavelength across the InP-based wafer from which the chips were part thereof.

2. The photonic integrated circuit (PIC) chip of claim 1 wherein the waveguide core is embedded with a non-Al-containing compound.

3. The photonic integrated circuit (PIC) chip of claim 2 where said compound is InP, InGaP or InGaAsP.

4. The photonic integrated circuit (PIC) chip of claim 1 wherein one of the monolithic optical components is a photodiode optical coupled to other optical components in the photonic integrated circuit via the waveguide core.

5. The photonic integrated circuit (PIC) chip of claim 4 wherein the photodiode is a PIN photodiode.

6. The photonic integrated circuit (PIC) chip of claim 4 wherein the photodiode is an avalanche photodiode (APD).

7. The photonic integrated circuit (PIC) chip of claim 6 wherein the avalanche photodiode (APD) comprises spatially disposed layers comprising a multiplication layer, a charge layer and an absorption layer, the waveguide core embedded between the multiplication layer and the absorption layer, adjacent to the charge layer.

8. The photonic integrated circuit (PIC) chip of claim 1 wherein one of the monolithic optical components is an optical combiner or optical decombiner.

9. The photonic integrated circuit (PIC) chip of claim 8 wherein the optical combiner or optical decombiner is an Echelle grating or array waveguide grating (AWG) optically coupled to other optical components in the photonic integrated circuit (PIC) via the waveguide core.

10. The photonic integrated circuit (PIC) of claim 9 further comprising a stop etch layer overlying the aluminum-containing waveguide core embedding the waveguide core to prevent its subsequent oxidation and degradation, said stop etch layer less in thickness than immediately adjacent layers so that it will not interfere with the functionality of the circuit.

11. The photonic integrated circuit (PIC) chip of claim 1 wherein the chip comprises an optical transmitter photonic integrated circuit (TxPIC) having sets of laser sources and electro-optic modulators with each set sharing the same Al-containing waveguide core and an optical combiner to combine optical signals received from the laser/modulator waveguide cores.

12. The photonic integrated circuit (PIC) chip of claim 11 wherein the laser sources comprise a DFB laser array or a DBR laser array.

13. The photonic integrated circuit (PIC) chip of claim 11 wherein the electro-optic modulators comprise a electro-absorption modulator (EAM) array or a Mach-Zehnder modulator (MZM) array.

14. The photonic integrated circuit (PIC) chip of claim 11 wherein the optical combiner comprises an Echelle grating or an arrayed waveguide grating (AWG).

15. The photonic integrated circuit (PIC) chip of claim 1 wherein the chip comprises an optical receiver photonic integrated circuit (RxPIC) including an optical decombiner having an aluminum-containing input waveguide core and a plurality of output aluminum-containing input waveguide cores with each waveguide core shared with an active region of an integrated photodetor.

16. The photonic integrated circuit (PIC) chip of claim 15 wherein the optical decombiner comprises an Echelle grating or an arrayed waveguide grating (AWG).

17. The photonic integrated circuit (PIC) chip of claim 15 wherein the array of photodetectors comprises an avalanche photodiode (APD) array or a PIN photodiode array.

18. A photonic integrated circuit (PIC) chip wherein a plurality of such chips are formed in an InP-based wafer:
   each chip comprising a plurality of monolithic InP-based optical components forming the integrated circuit that are optically coupled to an input or to an output of the circuit or both and including a Al-containing waveguide core;
   the waveguide core comprising InAlGaAs, combined layers of InGaAs/InAlAs, InGaAs/InAlGaAs or InAlAs/InAlGaAs or stacks of such layers;
   deployment of the waveguide core providing for high uniform photoluminescent (PL) emission wavelength across the wafer from which the chips were part thereof;
   at least one of the monolithic optical components comprising an avalanche photodiode (APD) that is optically coupled to other optical components in the photonic integrated circuit via the waveguide core and comprises spatially disposed layers including a multiplication layer, a charge layer and an absorption layer;
   the waveguide core embedded between the multiplication layer and the absorption layer, adjacent to the charge layer where the charge layer is or forms part of the waveguide core.

19. The photonic integrated circuit (PIC) chip of claim 18 wherein the charge layer includes at least one additional Group III–V layer in combination with the waveguide core, which together provide an overall high doping level concentration.

20. The photonic integrated circuit (PIC) chip of claim 19 wherein said charge layers comprise a doped waveguide core layer and an InP layer.

21. The photonic integrated circuit (PIC) chip of claim 20 wherein the InP layer is also a stop etch layer embedding the waveguide core to prevent its subsequent oxidation and degradation.

22. The photonic integrated circuit (PIC) chip of claim 18 wherein a stop etch layer is provided adjacent to the waveguide core to embed the core to prevent its subsequent oxidation and degradation.

23. The photonic integrated circuit (PIC) chip of claim 22 wherein the stop etch layer is InP, InGaP, or InGaAsP.

24. The photonic integrated circuit (PIC) chip of claim 18 where the avalanche photodiode (APD) further comprises a charge layer region having a plurality of layers, one of said layers not readily capable of being doped to high doping concentrations and at least one of the other of said layers readily capable of being doped to high doping concentrations, the combined layers providing for an overall high dopant concentration level for the combined photodiode charge layer region.

25. The photonic integrated circuit (PIC) chip of claim 24 wherein the charge layer is comprised of InAlAs and the at least one of the other of said layers comprises InP.

26. The photonic integrated circuit (PIC) chip of claim 25 wherein said InP is n-doped to concentration levels in the range of at least about $10^{18}$ to about $10^{19}$.

27. An avalanche photodiode (APD) comprising:
a plurality of semiconductor layers including separate multiplication, charge and absorption layers;
a waveguide core included in the plural layers, the waveguide core comprising an Al-containing layer adjacent to a first surface of the charge layer and formed between the multiplication layer and the absorption layer, a stop etch layer of non-Al containing compound positioned adjacent to a second surface of the waveguide core layer and deposited after the deposition of the Al-containing waveguide core to protect it from subsequent oxidation and degradation.

28. The avalanche photodiode (APD) of claim 27 wherein the waveguide core comprises InAlGaAs or combined layers of InGaAs/InAlAs, InGaAs/InAlGaAs or InAlAs/InAlGaAs or stacks of such layers.

29. The avalanche photodiode (APD) of claim 28 wherein the non-Al containing compound is InP, InGaP or InGaAsP.

30. The avalanche photodiode (APD) of claim 27 wherein the charge layer comprises the waveguide core.

31. The avalanche photodiode (APD) of claim 30 wherein the charge layer includes at least one additional layer so that the combination of the charge layer and the at least one additional layer provides for an overall high doping level concentration.

32. The avalanche photodiode (APD) of claim 31 wherein said charge layers comprise doped InAlGaAs and InP layers.

33. The avalanche photodiode (APD) of claim 32 wherein the InP layer also functions as stop etch layer embedding the waveguide core to prevent its subsequent oxidation and degradation.

34. The avalanche photodiode (APD) of claim 27 wherein a stop etch layer is provided adjacent to the waveguide core to embed the core to prevent its subsequent oxidation and degradation.

35. The avalanche photodiode (APD) of claim 34 wherein the stop etch layer is InP, InGaP or InGaAsP.

36. The avalanche photodiode (APD) of claim 27 wherein the charge layer includes at least one additional charge layer, one of said layers not readily capable of being doped to high doping concentrations and at least one of the other of said layers readily capable of being doped to high doping concentrations, the combined charge layers providing for an overall high dopant concentration level for the combined photodiode charge layers.

37. The avalanche photodiode (APD) of claim 36 wherein the one charge layer is comprised of doped InAlAs and the other of the charge layers comprises doped InP.

38. The avalanche photodiode (APD) of claim 27 wherein the waveguide care of the photodiode is integrated to at least one other optical component, the waveguide core of the photodiode comprising a communal integrated path with a waveguide core of the other optical component.

39. The avalanche photodiode (APD) of claim 38 wherein the other optical component is an array waveguide grating (AWG) or an optical semiconductor amplifier (SOA).

40. The avalanche photodiode (APD) of claim 38 wherein the waveguide core is InAlGaAs.

41. The avalanche photodiode (APD) of claim 40 wherein a stop etch layer is provided adjacent to the waveguide core to embed the core to prevent its subsequent oxidation and degradation.

42. The avalanche photodiode (APD) of claim 41 wherein the stop etch layer is InP, InGaP or InGaAsP.

43. An avalanche photodiode (APD) comprising:
a plurality of semiconductor layers including a multiplication layer, a charge region and an absorption layer;
a waveguide included in the plural layers comprising an Al-containing layer formed adjacent to the charge (C) region and between the multiplication (M) layer and the absorption (A) layer; and
the charge (C) region comprising at least two layers, one of the at least two charge layers not readily capable of being doped to a high doping concentration and the other the at least two layers capable of being doped to a high doping concentration, the combined charge layers providing for an overall high dopant concentration level relative to an average carrier density of the combined charge layers.

44. The avalanche photodiode (APD) of claim 43 wherein the charge region layers respectively comprise InAlGaAs or combined layers of InGaAs/InAlAs, InGaAs/InAlGaAs or InAlAs/InAlGaAs or stacks of such layers, and InP.

45. The avalanche photodiode (APD) of claim 43 wherein the charge (C) region includes a waveguide core optically coupling together a plurality of optical components in a photonic integrated circuit (PIC).

46. The avalanche photodiode (APD) of claim 45 wherein the photonic integrated circuit (PIC) includes an array of avalanche photodiodes coupled to an arrayed waveguide grating (AWG) demultiplexer forming an optical receiver photonic integrated circuit (RxPIC).

47. The avalanche photodiode (APD) of claim 43 wherein the average carrier density of the combined charge layers is in the range of about $10^8$ to about $10^9$.

48. The avalanche photodiode (APD) of claim 43 wherein the carrier density of the charge layer not readily capable of being doped to a high doping concentration has a doping concentration not generally exceeding $5 \times 10^{17}$.

* * * * *